US010484000B2

(12) United States Patent
Martens et al.

(10) Patent No.: US 10,484,000 B2
(45) Date of Patent: Nov. 19, 2019

(54) ANALOG-TO-DIGITAL CONVERTERS

(71) Applicant: IMEC vzw, Leuven (BE)

(72) Inventors: Ewout Martens, Heverlee (BE);
Benjamin Hershberg, Leuven (BE);
Jan Craninckx, Boutersem (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/218,916

(22) Filed: Dec. 13, 2018

(65) Prior Publication Data

US 2019/0190531 A1 Jun. 20, 2019

(30) Foreign Application Priority Data

Dec. 19, 2017 (EP) .................................... 17208593

(51) Int. Cl.
*H03M 1/12* (2006.01)
*H03M 1/46* (2006.01)

(52) U.S. Cl.
CPC ............. *H03M 1/46* (2013.01); *H03M 1/462* (2013.01); *H03M 1/468* (2013.01)

(58) Field of Classification Search
CPC ........ H03M 1/468; H03M 1/46; H03M 1/466; H03M 1/12; H03M 1/804; H03M 1/002; H03M 1/08; H03M 1/1215; H03M 1/06; H03M 1/124; H03M 1/462; H03M 1/0836; H03M 1/0678; H03M 1/1225; H03M 1/1245; H03M 1/00; H03M 1/14; H03M 1/68; H03M 3/454
USPC .......................... 341/155, 156, 161, 160, 172
See application file for complete search history.

(56) References Cited

U.S. PATENT DOCUMENTS

| 4,940,981 A | * | 7/1990 | Naylor | ................. | H03F 3/45188 |
| | | | | | 341/136 |
| 5,138,319 A | * | 8/1992 | Tesch | .................. | H03M 1/1215 |
| | | | | | 341/141 |
| 5,684,487 A | * | 11/1997 | Timko | ................ | H03M 1/1047 |
| | | | | | 341/120 |

(Continued)

OTHER PUBLICATIONS

Ying-Zu Lin et al: "An Asynchronous Binary-Search ADC Architecture With a Reduced Comparator Count", IEEE Transactions on Circuits and Systems I: Regular Papers, IEEE, US, vol. 57, No. 8, Aug. 2010 (Aug. 2010), pp. 1829-1837.

(Continued)

*Primary Examiner* — Linh V Nguyen (74) *Attorney, Agent, or Firm* — Knobbe, Martens, Olson & Bear, LLP (57) ABSTRACT

A SAR DAC architecture is disclosed. In one aspect, the SAR DAC architecture uses two parallel DACs for performing a comparison and feedback simultaneously. While one DAC executes a feedback step, the output of the other DAC is used as input for a comparator. For fast operation, the comparator performs the comparison with a reference voltage that has a positive or negative offset from a mid-scale value. The sign of the offset is determined by a previous comparison step. As a result, the same delay can be used for each DAC feedback and comparison, reducing the total conversion time to the time needed for N comparisons for an N-bit architecture, which is a reduction of almost a factor of 2 compared to the conventional SAR architecture.

15 Claims, 7 Drawing Sheets

(56) References Cited

U.S. PATENT DOCUMENTS

| | | | | |
|---|---|---|---|---|
| 7,515,083 | B2* | 4/2009 | Chen | H03M 1/145 341/156 |
| 8,159,382 | B2* | 4/2012 | Srinivasa | H03M 1/002 341/155 |
| 8,508,400 | B2* | 8/2013 | Wu | H03M 1/0673 341/118 |
| 2008/0036641 | A1* | 2/2008 | Confalonieri | H03M 1/0682 341/172 |
| 2012/0154194 | A1* | 6/2012 | Chang | H03M 1/002 341/158 |
| 2014/0231582 | A1* | 8/2014 | Headrick | B64C 27/08 244/54 |
| 2016/0373124 | A1* | 12/2016 | Kijima | H03M 1/38 |
| 2017/0201268 | A1 | 7/2017 | Sharma et al. | |

OTHER PUBLICATIONS

Lin He et al., "A Speed-Enhancing Dual-Trial Instantaneous Switching Architecture for SAR ADCs", IEEE Transactions on Circuits and Systems, II: Express Briefs, vol. 62, No. 1, pp. 26-30, Jan. 2015 (Jan. 2015).

G. Van Der Plas et al., "A 150MS/s 133 µW 7b ADC in 90nm digital CMOS", EEE Journal of Solid-State Circuits, vol. 43, No. 12, pp. 2631-2640, Dec. 2008.

Bob Verbruggen et al., "A 1.7 mW 11 b 250 MS/s 2-Times Interleaved Fully Dynamic Pipelined SAR ADC in 40 nm Digital CMOS", IEE.E Journal of Soljd.State Circuits, vol. 4 7, No. 12, pp. 2880-2887, Dec. 2012.

Junfeng Gao et al., An Amplifier-Free Pipeline-SAR ADC Architecture With Enhanced Speed and Energy Efficiency IEEE Transactions on Circuits and Systems—II: Express Briefs, vol. 63, No. 4, pp. 341-345, Apr. 2016.

Mustafa Kilic et al., "A DAC Assisted Speed Enhancement Technique for High Resolution SAR ADC" Prime 2017, Giardini Naxos-Taormina, Italy, pp. 253-256.

Extended European Search Report completed on Jun. 25, 2018 in counterpart EP 17 20 8593.8, filed on Dec. 19, 2017.

* cited by examiner

ANALOG-TO-DIGITAL CONVERTERS

CROSS-REFERENCE TO RELATED APPLICATIONS

This application claims foreign priority to European Patent Application No. 17208593.8, filed Dec. 19, 2017, the contents of which are incorporated by reference herein in its entirety.

BACKGROUND

Technological Field

The disclosed technology relates to improvements in or relating to analog-to-digital converters, and, is more particularly concerned with low-power high-speed analog-to-digital converters.

Description of the Related Technology

A successive approximation register (SAR) analog-to-digital converter (ADC) is one of the most energy-efficient ADC architectures. Conversion is achieved by implementing a successive approximation algorithm which compares a residue voltage with a fixed reference, and, by applying a feedback, which is dependent on the result of the comparator, to generate a new residue voltage for the next step of the algorithm. A typical implementation uses a capacitive digital-to-analog converter (DAC) and a comparator.

The speed of a SAR ADC is limited due to its sequential operation, that is, the output of one stage determines the comparison for a subsequent stage, and a sequence of comparison and DAC feedback operations needs to be performed. For a conventional SAR ADC with N bits of resolution, this requires at least N comparisons and (N−1) DAC feedback steps. Consequently, the total conversion time is mainly determined by N comparator delays and (N−1) delays for the DAC feedback.

A single channel asynchronous SAR ADC with two capacitive DAC arrays is described in "A Speed-Enhancing Dual-Trial Instantaneous Switching Architecture for SAR ADCs" by Lin He, Jiaqi Yang, Duona Luo, Lele Jin, Shuangshauang Zhang, Fuhiang Lin, Libin Yao and Xicheng Jiang, IEEE Transactions on Circuits and Systems, II: Express Briefs, Vol. 62, No. 1, January 2015 (referred to as He et al.). Two comparators are assigned to each DAC that alternately switch between the compare phase and the reset or feedback stage. Such an arrangement allows for the overlapping of the DAC settling, the comparator reset, and the comparator regeneration and significantly improves the conversion speed. The SAR ADC described contains a sample-hold switch, two capacitive DAC arrays, four dynamic comparators, a data register and a shift register. The operation is divided into a sampling phase, in which the sample-hold switch turns on and samples the input signal into the capacitive DAC arrays as the data register and the shift register are reset, and a conversion phase, in which the sample-hold switch turns off and the polarity of the sampled input is detected using the dynamic comparators.

The He et al. disclosure addresses the issue of settling by using two DACs which start settling immediately after completion of the comparator pre-amplification so that once the comparison has been completed, one of the two DACs is ready for the next comparison. In the specific architecture disclosed, whilst the conversion speed is faster than a conventional SAR ADCs, it comes at the cost of high switching energy and complicated logic to select the appropriate DAC after the comparison has been made.

SUMMARY OF CERTAIN INVENTIVE ASPECTS

In accordance with the disclosed technology, delays for the DAC feedback are effectively eliminated, for example, by having two DAC paths in parallel where the comparison stage and the feedback stage are performed concurrently, instead of sequentially, with an improvement of approximately a factor of two for the conversion speed without any increase in switching energy.

In accordance with one aspect of the disclosed technology, there is provided a successive approximation register analog-to-digital architecture comprising:
   at least one digital-to-analog converter configured for receiving an analog input signal and a first digital code, and for generating an output signal therefrom;
   at least one comparator configured for receiving the output signal from the at least one digital-to-analog converter at a first input, for comparing the output signal with at least one reference signal applied to a second input, and for providing a bit output indicative of the comparison between the at least one reference signal and the output signal; and
   a logic circuit configured for providing the first digital code to the at least one digital-to-analog converter and subsequent digital codes in response to the bit output from a preceding comparison step, for controlling the operation of the at least one comparator, for receiving the bit output signal from the at least one comparator, and for generating an output signal;
   characterized in that the at least one digital-to-analog converter comprises a first digital-to-analog converter and a second digital-to-analog converter, the first and second digital-to-analog converters being arranged in parallel and configured for receiving the same input signal and the same digital code, the first and second digital-to-analog converters together with the at least one comparator forming respective first and second paths, the first path being configured for deriving odd bits in the digital code and the second path being configured for deriving even bits in the digital code;
   and in that the first digital-to-analog converter is further configured for performing feedback tasks for the derived bits of the digital code simultaneously with the at least one comparator performing a comparison step for the even bits of the digital code, and the second digital-to-analog converter is further configured for performing feedback tasks for the derived bits of the digital code simultaneously with the at least one comparator performing comparison steps for the odd bits of the digital code.

By having two digital-to-analog converters which perform feedback tasks for the respective odd and even bits of the digital code and pass their output analog voltage to a comparator for comparison with a reference signal or value, the comparison of odd bits can take place at the same time or substantially the same time as the result of the comparison for even bits is being fed back to the respective digital-to-analog converter. This has the advantage of reducing the operating time of the successive register approximation analog-to digital converter by approximately half.

In an embodiment, the at least one reference signal is applied to a second input of the at least one comparator. Such a reference signal may be derived from the logic circuit in accordance with the result of the comparison of a preceding comparison step.

In an embodiment, the reference signal applied to the second input of the at least one comparator may comprise a mid-scale value having an offset determined by a preceding comparison step. Naturally, the first comparison has a predetermined offset which is chosen to be 0 with following comparisons having a reference signal which is determined in accordance with a preceding comparison step.

In an embodiment, a single comparator may be used for the comparison of the processing of both the odd and even bits. This is due to each comparison being performed at the same time or substantially the same time as a feedback task. In this embodiment, a switch is provided for alternately switching between the outputs from each of the first and second digital-to-analog converters for directing the outputs therefrom to the first input of the single comparator.

A single comparator being used with two digital-to-analog converters in the architecture in accordance with the disclosed technology has the advantage as there is no mismatch between the comparators.

In an embodiment, the at least one comparator may comprise a first comparator configured for receiving the output from the first digital-to-analog converter and for generating odd bits output, and second comparator configured for receiving the output from the second digital-to-analog converter and for generating even bits output, the first and second comparators being configured so as to perform their respective comparisons in an alternating fashion.

In an embodiment, the at least one reference signal may comprise at least one built-in offset value within the at least one comparator. In this case, the at least one comparator may comprise an input configured for receiving a control signal for selecting one of the offset values in accordance with the result of a preceding comparison step.

In accordance with another aspect of the disclosed technology, there is provided an analog-to-digital converter comprising:
  a first successive approximation register analog-to-digital architecture as described above configured so as to be connected to an input signal and configured for generating a first output code;
  a digital-to-analog converter configured for receiving the input signal and the first output code from the first successive approximation register analog-to-digital architecture, and, for providing an output signal;
  a second analog-to-digital converter architecture configured for receiving the output signal and for generating a second output code; and
  a combiner configured for receiving the first and second output codes and for generating an output signal therefrom.

An advantage of this configuration is that the first successive approximation register analog-to-digital architecture can provide a coarse output value with the second analog-to-digital architecture providing a fine output value, which, when combined, provide a more accurate overall analog-to-digital conversion. In one embodiment, the second analog-to-digital converter architecture may comprise a successive approximation register analog-to-digital converter architecture.

In accordance with another aspect of the disclosed technology, there is provided a method of converting an analog signal to a digital signal, the method comprising:
  receiving an analog input signal using at least one digital-to-analog converter;
  providing a first digital code to the at least one digital-to-analog converter from a logic circuit;
  processing the analog input signal together with the digital code in the at least one digital-to-analog converter;
  generating an output signal from the at least one digital-to-analog converter;
  receiving the output signal from the at least one digital-to-analog converter at a first input of at least one comparator;
  comparing the output signal with at least one reference signal;
  generating a bit output indicative of the comparison between the at least one reference signal and the output signal;
  receiving the bit output signal from the at least one comparator at the logic circuit and generating a subsequent digital code in accordance with the bit output signal; and
  controlling the operation of the at least one comparator and the first and second digital-to-analog converters using the logic circuit;
  generating an output signal from the logic circuit after repeating at least a subset of the above from the first providing step using the bit output signal from the at least one comparator;
  where the method further comprises, for each bit of the at least one digital-to-analog converter:
  deriving odd bits of the digital input signal in a first digital-to-analog converter and the at least one comparator and even bits of the digital input signal in a second digital-to-analog converter and the at least one comparator; and
  performing feedback for the derived bits of the digital signal simultaneously with the processing of the even bits of the digital signal, and performing feedback for the derived bits of the digital signal simultaneously with the processing of the odd bits of the digital signal.

An advantage of the method in accordance with the disclosed technology is that processing time is reduced as comparisons for odd bits can be performed simultaneously with feedback tasks for even bits.

In an embodiment, the method may further comprise alternately switching a first input to a single comparator between output signals from the first and second digital-to-analog converters; and
  performing a comparison between respective output signals and at least one reference signal whose offset is determined in accordance with a preceding comparison step.

In an embodiment, the method may further comprise:
  generating a first output bit from a first comparator;
  generating a second output bit from a second comparator; and
  using the first and second output bits from respective ones of the first and second comparators for determining the output signal.

In an embodiment, the method may further comprise applying the at least one reference signal to the second input of the at least one comparator as a mid-scale value having an offset determined by a preceding comparison step.

In an embodiment, the method may further comprise using at least one built-in offset value in the at least one comparator for the at least one reference signal. In this case, the method may further comprise receiving, at the at least one comparator, a control signal for selecting one of the at least one offset values in accordance with the result of a preceding comparison step.

BRIEF DESCRIPTION OF THE DRAWINGS

For a better understanding of the disclosed technology, reference will now be made, by way of example, to the accompanying drawings in which.

DETAILED DESCRIPTION OF CERTAIN ILLUSTRATIVE EMBODIMENTS

The disclosed technology will be described with respect to particular embodiments and with reference to certain drawings but the disclosure is not limited thereto. The drawings described are only schematic and are non-limiting. In the drawings, the size of some of the elements may be exaggerated and not drawn to scale for illustrative purposes.

Examples of the SAR ADC in accordance with the disclosed technology are described below; however, these examples are not to be considered to be limiting and other examples of SAR ADCs in accordance with the disclosed technology are possible.

Figure 1:
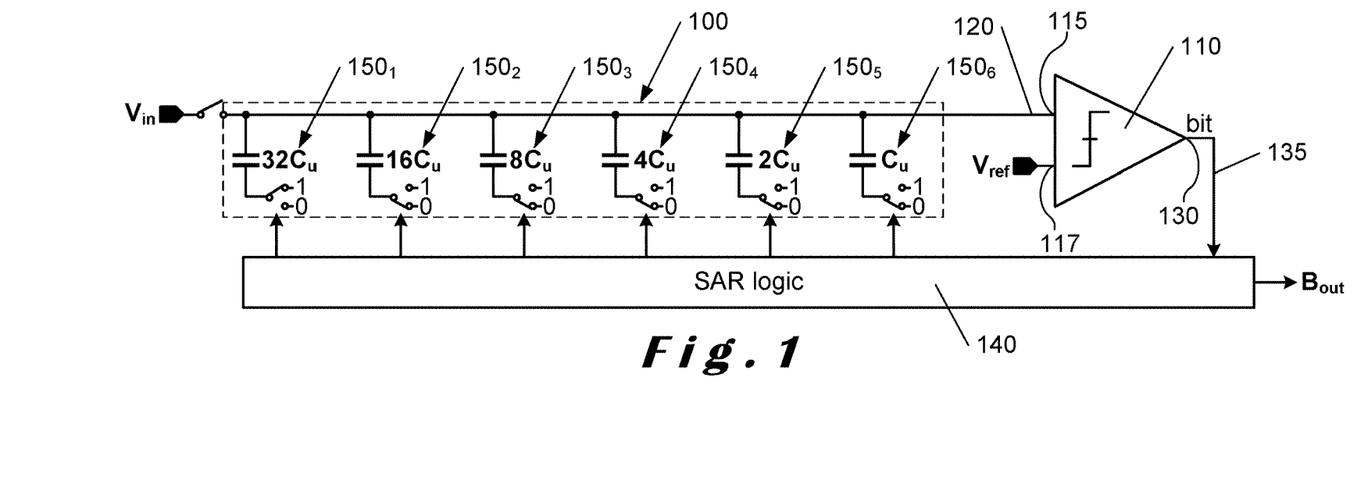
FIG. 1 illustrates a conventional 7-bit SAR ADC with capacitive DAC.

FIG. 1 illustrates a conventional 7-bit SAR ADC implemented as a capacitive DAC 100 and comparator 110. An analog input signal $V_{in}$ is applied to the DAC 100 which provides output 120. Output 120 from the DAC 100 forms a first input 115 of the comparator 110. The comparator 110 has a second input 117 to which a reference signal $V_{ref}$ is applied. An output 130 of the comparator 110 provides a bit input 135 for SAR logic 140 which relates to the comparison between the output 120 and a digital code provided by the SAR logic 140.

In the DAC 100, switched capacitors $150_1$, $150_2$, $150_3$, $150_4$, $150_5$, $150_6$ are provided and are connected to form output 120. The switched capacitors are controlled by the SAR logic 140 as shown in accordance with the digital code.

The output from the SAR logic 140 is indicated as $B_{out}$. Although not shown, the reference signal $V_{ref}$ for the comparator 110 is provided by the SAR logic 140. In a differential implementation, the output from first and second DACs form the inputs to the comparator and no reference signal $V_{ref}$ is needed.

In a first iteration of the analog-to-digital conversion, all the switched capacitors $150_1$, $150_2$, $150_3$, $150_4$, $150_5$, $150_6$ are set to '0' or '1'. The comparison of the analog input signal $V_{in}$ with the reference signal $V_{ref}$ in the comparator 110 provides a first bit, indicative of the first comparison, as a bit input 135 for the SAR logic 140. This first bit corresponds to the most significant bit (MSB) of the output signal $B_{out}$ which is stored in the SAR logic until all iterations have been performed. Depending on the value of the bit input 135, the first switched capacitor $150_1$ is set to either '0' or '1'. As shown in FIG. 1, the first switched capacitor $150_1$ is set to '1', which may be in accordance with the result of the comparison in the first iteration.

In a second iteration, the second MSB of the analog input signal $V_{in}$ is determined in a similar way and stored in the SAR logic 140 for output when all bits have been processed. The reference signal for the comparator is adjusted in accordance with the comparison in a similar way as described below, the sign thereof being determined in accordance with the sign of the first bit.

Similarly, in the third and subsequent iterations, the next significant bit of the analog input signal $V_{in}$ is determined and stored with the SAR logic 140 storing each bit until the final bit has been determined. The bits are added together to form the digital output signal $B_{out}$ corresponding to the analog input signal $V_{in}$.

The sampling of the analog input signal $V_{in}$ may be performed in the DAC 100 or may be performed by a sample-and-hold circuit (not shown).

Figure 2:
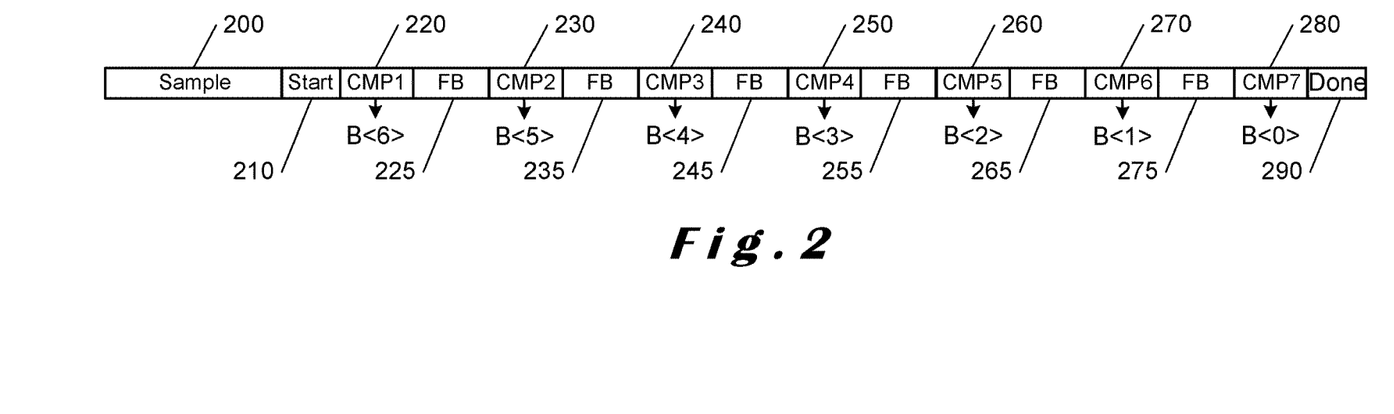
FIG. 2 illustrates a timing diagram for the 7-bit SAR ADC of FIG. 1.

FIG. 2 illustrates a timing diagram for the SAR ADC described above with reference to FIG. 1. As shown, after taking the sample 200 and starting the conversion process, each comparison task 220, 230, 240, 250, 260, 270 has a corresponding feedback task 225, 235, 245, 255, 265, 275 with the final comparison task 280 being the last task with no feedback task and the conversion process being completed at 290.

Figure 3:
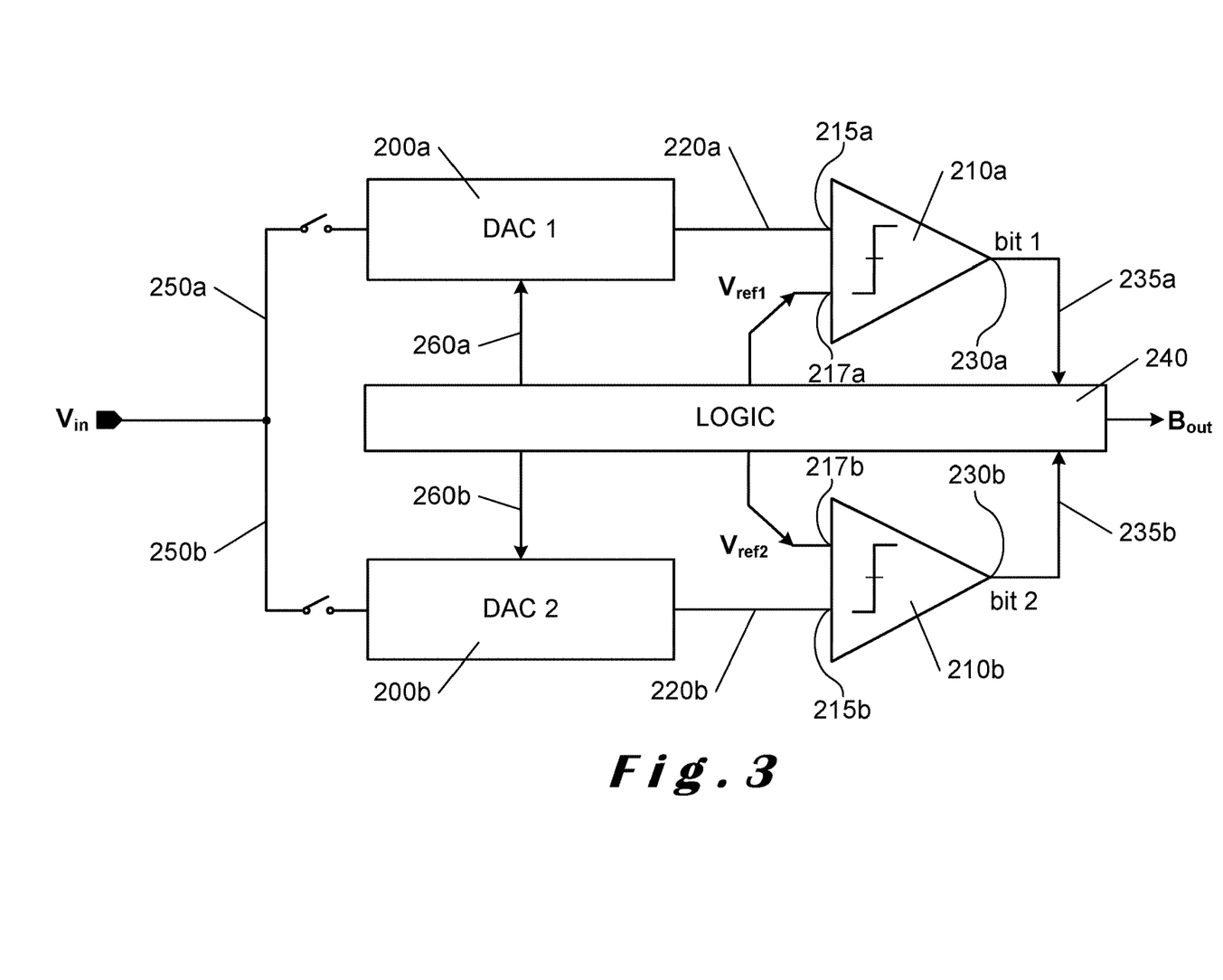
FIG. 3 illustrates a basic architecture of a SAR ADC without DAC feedback delay in accordance with the disclosed technology.

As described above, the SAR ADC of the disclosed technology eliminates delays for the feedback tasks in the timing diagram so that the total time for conversion is only determined by the comparator delays as will be described in more detail below. In effect, the delay for feedback tasks are executed concurrently with the comparison tasks instead of sequentially. In order to be able to achieve this parallelism, the input signal is sampled onto two DACs rather than on a single DAC as in FIG. 1. FIG. 3 illustrates the SAR DAC architecture in accordance with the disclosed technology.

In FIG. 3, two DACs 200a, 200b are shown, where each DAC corresponds to the DAC 100 of FIG. 1. An input signal $V_{in}$ is split to form two inputs 250a, 250b for respective ones of the first and second DACs 200a, 200b. Outputs 220a, 220b from respective ones of the first and second DACs 200a, 200b are connected, respectively, to a first input 215a of a first comparator 210a and to a first input 215b of a second comparator 210b. A reference signal $V_{ref1}$, provided by SAR logic 240, is applied to a second input 217a of the first comparator 210a, and a reference signal $V_{ref2}$, provided by SAR logic 240, is applied to a second input 217b of the second comparator 210b. The reference signals $V_{ref1}$ and $V_{ref2}$ are derived from a reference signal (not shown) which is applied to the SAR logic 240. Outputs 230a, 230b from respective ones of the first and second comparators 210a, 210b form bit inputs 235a, 235b for the SAR logic 240. The SAR logic 240 provides an output $B_{out}$, for example, in a similar way to that described above with reference to FIG. 1, where the odd bits of the output are derived using a first path including the first DAC 200a and the first comparator 210a, and the even bits of the output are derived using a second path including the second DAC 200b and the second comparator 210b.

In accordance with the disclosed technology, $V_{ref1}$ and $V_{ref2}$ change for each comparison under the control of the SAR logic 240 as described below.

As shown in FIG. 3, there are now two paths which can be timed to perform either comparison tasks or feedback tasks with the roles being swapped at each task as will be described in more detail below with reference to FIG. 4.

Although a single-ended architecture is shown in FIG. 3, it will readily be appreciated that a differential implementation is also possible.

Figure 4:
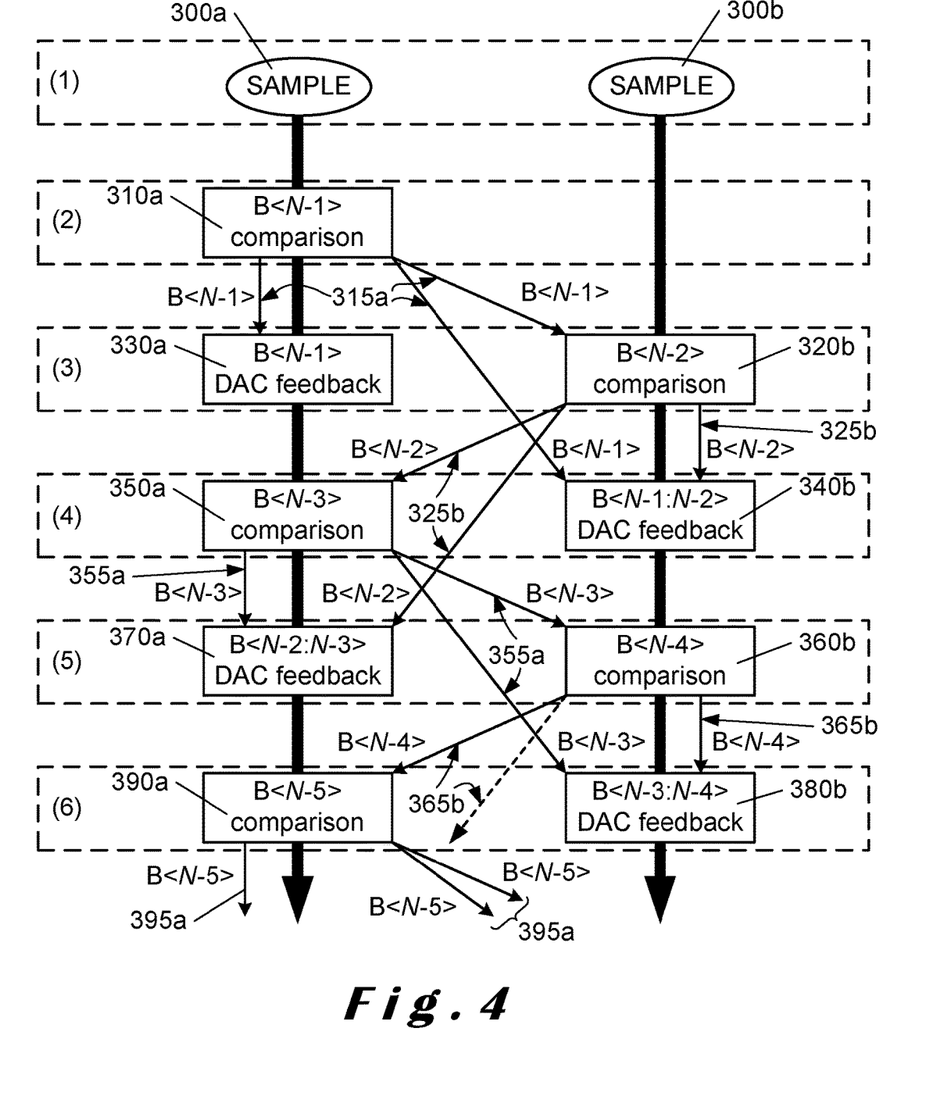
FIG. 4 illustrates general processing activity for a SAR ADC of FIG. 3.

FIG. 4 illustrates the operation of the SAR ADC architecture shown in FIG. 3 where there are two paths, a first path for the first DAC 200a and first comparator 210a, and a second path for the second DAC 200b and second comparator 210b. Each row illustrates what is happening in each of the two paths. Six rows are shown by way of example.

At row (1), initially DACs 200a, 200b are set to their reset state and input signal $V_{in}$ is sampled by each of the first and second DACs 200a, 200b simultaneously. In some embodiments, a sample-and-hold circuit may be embedded in each of the DACs, and, therefore, not provided as a separate circuit.

At row (2), the first comparator 210a performs comparison 310a to determine the most significant bit (MSB) whilst the second DAC 200b is idle. The MSB comparison uses a mid-scale reference level (e.g., $V_{mid}=V_R/2$ for a single-ended ADC implementation or $V_{mid}=0$ for a differential ADC implementation) in a similar way to that of a conventional SAR ADC. The MSB, B<N-1>, forms output 315a which is fed to the first DAC 200a and the second comparator 210b for row (3) below, and to the second DAC 200b for row (4) below.

At row (3), having B<N-1> determined, the second comparator 210b performs a comparison 320b to determine, for example, the next significant bit, B<N-2>, with respect to a reference level of $V_{mid}+V_R/4$ or $V_{mid}-V_R/4$ depending on the value of output 315a (B<N-1>) from the first comparator 210a at row (2) above. By comparing the input voltage with either $V_{mid}+V_R/4$ or $V_{mid}-V_R/4$ (an adjusted reference voltage), it is possible for comparator 210b to perform a comparison 320b that determines the subsequent bit, B<N-2>, without waiting for feedback from the first DAC 200a. Simultaneously, the first DAC 200a can perform the feedback task 330a also using the output 315a (B<N-1>) by switching the capacitors corresponding to the most significant bit to '0' or '1' depending on the value of output 315a (B<N-1>). The second comparator 210b provides an output 325b (B<N-2>) which is fed to the second DAC 200b and to the first comparator 210a for row (4) below, and to the first DAC 200a for row (5) below.

At row (4), once the comparison 320b and feedback 330a have been completed, the first comparator 210a performs comparison 350a to determine the next significant bit, B<N-3>, with respect to a reference of $V_{mid}+V_R/8$ or $V_{mid}-V_R/8$ depending on the value of output 325b, B<N-2>, from the second comparator 210b at row (3) above. The second DAC 200b performs a feedback task 340b using output 315a, B<N-1>, from the first comparator 210a in row (2) above and the output 325b, B<N-2>, from the second comparator 210b from the comparison 320b in row (3) above. Thus, the capacitors corresponding to the first and second MSBs are switched to '0' or '1' depending on the value of the output 315a and 325b. The first comparator 210a provides an output 355a, B<N-3>, which is fed to the first DAC 200a and to the second comparator 210b for row (5) below and to the second DAC 200b for row (6) below.

At row (5), once the comparison 350a and feedback 340b tasks have been completed, the second comparator 210b performs comparison 360b to determine the next significant bit, B<N-4>with respect to a reference of $V_{mid}+V_R/16$ or $V_{mid}-V_R/16$ depending on the value of the output 355a (B<N-3>) obtained from the first comparator 210a at row (4) above. The first DAC 200a performs a feedback task 370a using the output 325b, B<N-2> from the comparison 320b in row (3) above and the output 355a, B<N-3>, from the comparison 350a in row (4) above. The second comparator 210b provides an output 365b, B<N-4> which is fed to the second DAC 200b and to the first comparator 210a for row (6) and any subsequent feedback tasks (not shown).

At row (6), once the comparison 360b and feedback 370a tasks have been completed, the first comparator 210a performs comparison 390a to determine the next significant bit, B<N-5>, with respect to a reference of $V_{mid}+V_R/32$ or $V_{mid}-V_R/32$ depending on the value of the output 365b, B<N-4>, from the second comparator 210b in row (5) above. The second DAC 200b performs a feedback task 380b using output 355a, B<N-3>, from the comparison 350a in row (4) above and output 365b, B<N-4>, from the comparison 360b in row (5) above. The first comparator 200a provides an output 395a, B<N-5>, from the comparison which is fed to the second DAC 200b for subsequent comparison and feedback tasks (not shown).

As can clearly be seen, the first and second paths alternate between comparison and feedback tasks at each of rows (2) to (6) as described above with each path, defined by the operation of the first and second DACs 200a, 200b, swapping after completion of a feedback task using the bits determined in the two previous tasks. In the path where there is a comparison, the comparison is made with respect to a reference of $V_R/2+V_{threshold}$ or $V_R/2-V_{threshold}$ depending on the value of the bit determined, for example, in the previous task.

As both the comparison and the feedback tasks occur simultaneously, the conversion time is significantly reduced when compared to a conventional SAR ADC. The time spent for each task is fixed in a synchronous architecture whereas, in an asynchronous architecture, the task ends when a signal indicates that the comparator has finished, thereby ending the feedback task.

Figure 5:
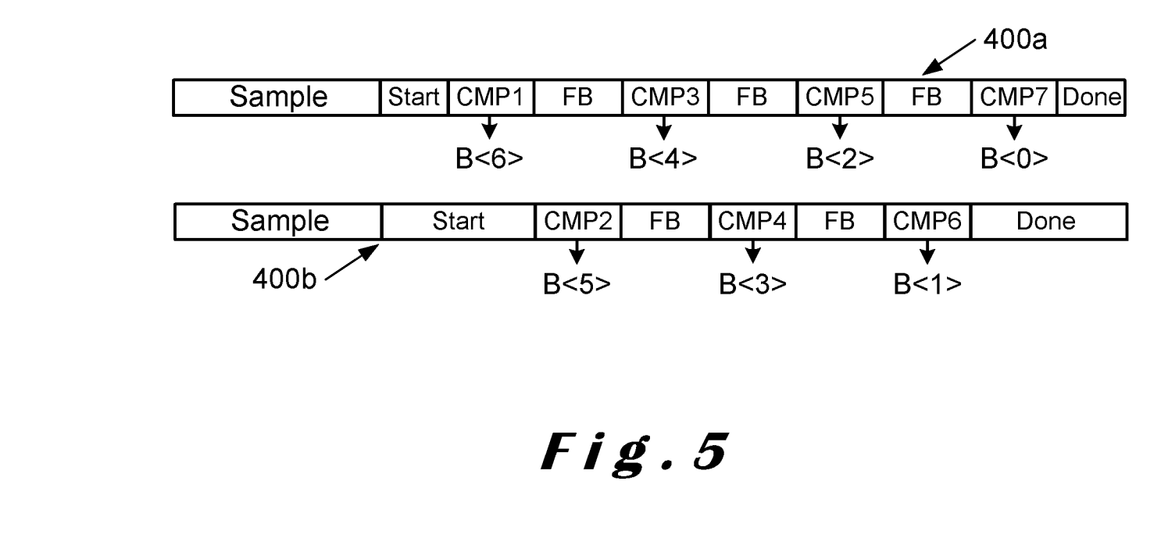
FIG. 5 illustrates a timing diagram for the SAR ADC of FIG. 3.

FIG. 5 illustrates a timing diagram for the SAR ADC architecture shown in FIG. 3 (N=7) with the path determined by the first DAC 200a being indicated by 400a and the path determined by the second DAC 200b being indicated by 400b. In line with the tasks described above with reference to FIG. 4, the timing diagram shows an example where the most significant bit, B<6>, is determined by a first comparison, CMP1, by the first DAC 200a; the next most significant bit, B<5>, is determined by a second comparison, CMP2, by the second DAC 200b when the feedback is being performed for the first DAC 200a; the next most significant bit, B<4>, is determined by a third comparison, CMP3, by the first DAC 200a when the feedback is being performed for the second DAC 200b; the next most significant bit, B<3>, is determined by a fourth comparison, CMP4, by the second DAC 200b when the feedback is being performed for the first DAC 200a; the next most significant bit, B<2>, is determined by a fifth comparison, CMPS, by the first DAC 200a when the feedback is being performed for the second DAC 200b; the next most significant bit, B<1>, is determined by a sixth comparison, CMP6, by the second DAC 200b when the feedback is being performed for the first DAC 200a; and the last bit, B<0>, is determined by a seventh comparison, CMP7, by the first DAC 200a when the second DAC 200b has completed the sixth comparison, CMP6.

Figure 6:
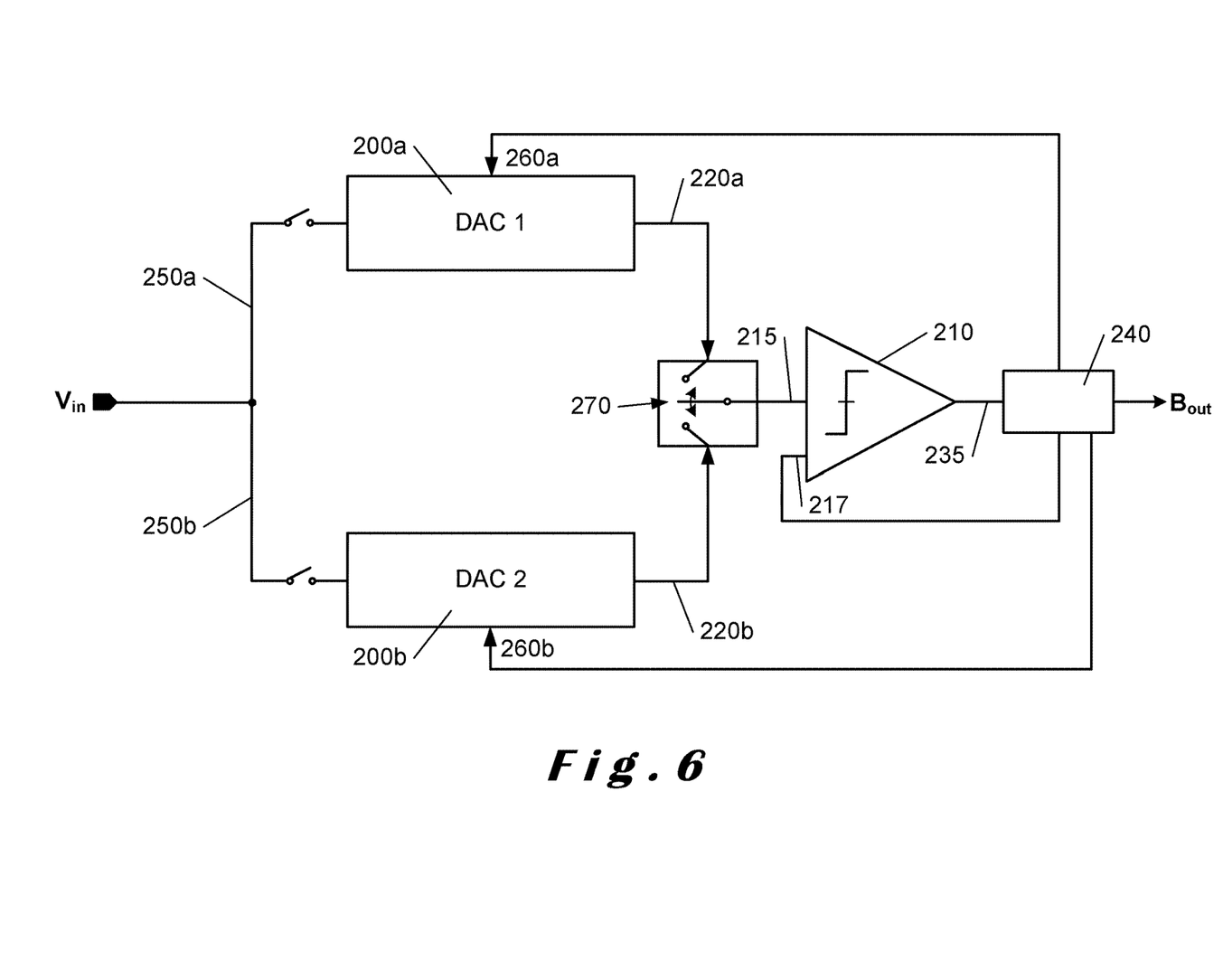
FIG. 6 is similar to FIG. 3 but with a single comparator in accordance with the disclosed technology.

The architecture of FIG. 6 is similar to that of FIG. 3 but having a single comparator 210 which generates a bit output 235 for the SAR logic 240. Components previously described with reference to FIG. 3 have the same reference numerals and will not be described again here.

In FIG. 6, a switch 270 is provided at a first input 215 to the comparator 210, the switch, under the control 260a, 260b of the SAR logic 240, being switched based on the output 220a of the first DAC 200a and the output 220b of the second DAC 200b. A second input 217 for the comparator 210 is controlled by SAR logic 240 to provide appropriate reference values against which the outputs 220a, 220b from the first and second DACs 200a, 200b respectively are compared.

In this embodiment, the feedback tasks in the first and second DACs 200a, 200b are performed at the same time as the comparison task in the comparator 210 as described above. This is possible as no comparison tasks are launched at the same time. By having a single comparator 210, mismatches between the comparators can be eliminated. In some embodiments, the comparator will need to be reset between comparisons.

The use of two comparators has the advantage that while one comparator is performing one comparison, the other comparator can be reset while the DAC in the path with the resetting comparator is performing a feedback task.

Instead of using comparators with external reference voltages, as shown in FIG. 3, comparators with tunable built-in offset can be used to eliminate the need for extra reference voltages, the tunable built-in offset providing a plurality of offset values which can effectively be selected. In this case, the tunable built-in offset is controlled by the SAR logic which provides an appropriate control signal to tune the built-in offset in accordance with the offset value required for a particular comparison.

The architecture shown in FIG. 3 is compatible with the use of the comparator-based controller as described in the article by B. Verbruggen, M. Iriguchi and J. Craninckx entitled "A 1.7 mW 11b 250 MS/s 2x Interleaved Fully Dynamic Pipelined SAR ADC in 40 nm Digital CMS", ISSCC 2012. In this configuration, there is a separate comparator for each comparison, and, at the start of the conversion (during sampling) all the comparators are in reset.

At point k of the algorithm, there are two possible reference levels for the comparator, and the result of the comparison at k−1 determines which one to use. Hence, two comparators can be used which are set up with two threshold levels, where only one is used each time. This technique is also used in a CABS (Comparator-based Asynchronous Binary Search) ADC described by G. Van der Plas and B. Verbruggen in "A 150 MS/s 133 µW 7b ADC in 90 nm Digital CMOS Using a Comparator-based Asynchronous Binary Search Sub-ADC", ISSCC 2008 (Van der Plas et al.).

Apart from the mid-scale level $V_{mid}$, the two threshold levels have the same magnitude but different sign. Hence, a comparator with an extra control signal to select the sign of the threshold can be employed.

Figure 7:
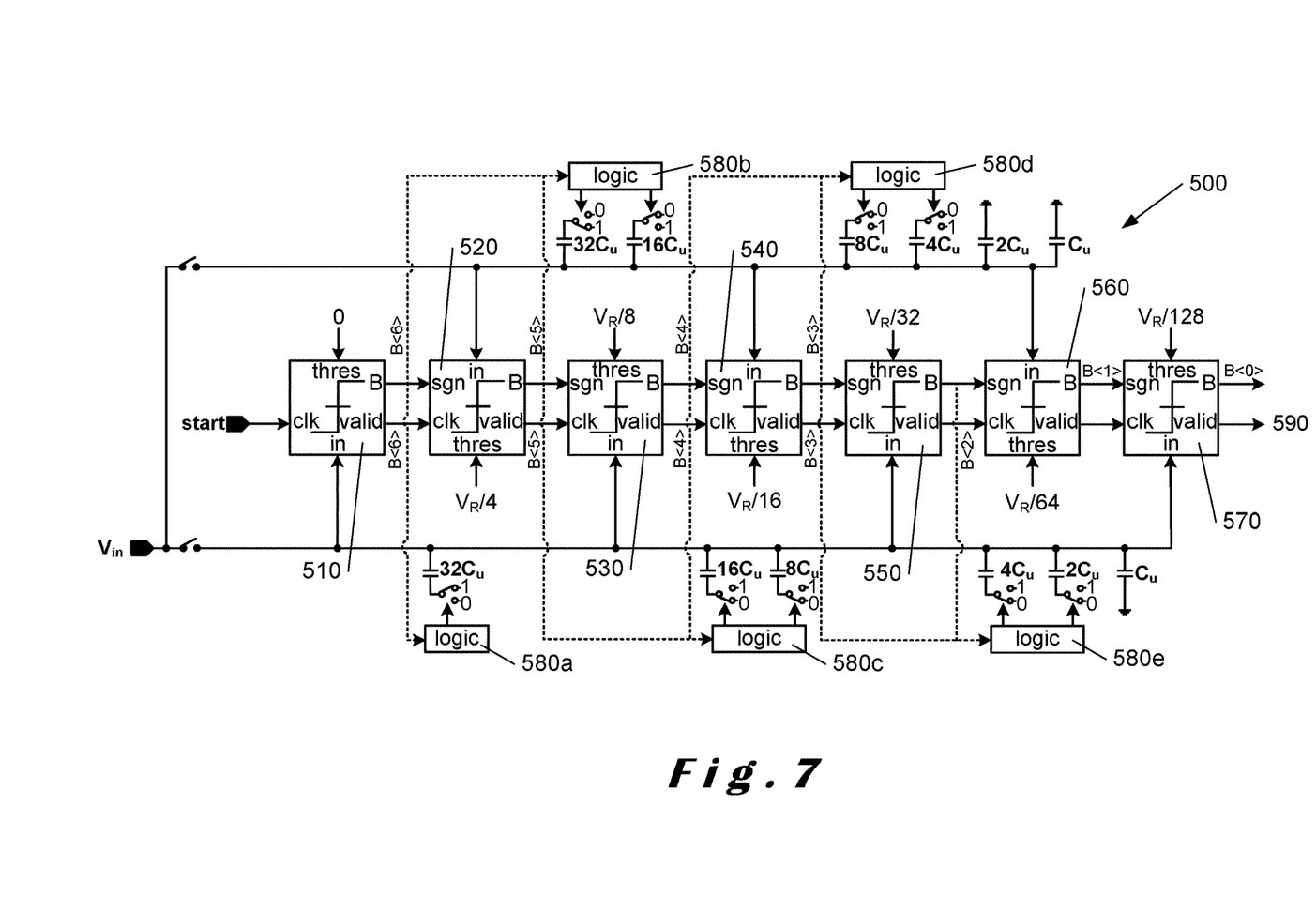
FIG. 7 illustrates a 7-bit SAR ADC in accordance with the disclosed technology.

An example of a 7-bit architecture 500 is shown in FIG. 7. The architecture 500 uses a different comparator 510, 520, 530, 540, 550, 560, 570 for each comparison, and, each comparator 520, 530, 540, 550, 560, 570 has a 'sgn' control signal which sets the sign of the threshold depending on the result of a previous comparison step. Each comparator 510, 520, 530, 540, 550, 560, 570 has a different threshold applied thereto.

As shown, an input signal $V_{in}$ is applied to each comparator 510, 520, 530, 540, 550, 560, 570 by appropriate switching controlled by the SAR logic elements 580a, 580b, 580c, 580d, 580e. Although the SAR logic elements are shown as separate components, it will be appreciated that they form part of a single SAR logic (not shown).

Comparator 510 has a threshold of '0' applied thereto and generates B<6> bit corresponding to the MSB (CMP1 as shown in FIG. 5) and the result thereof is used for the 'sgn' signal applied to the following comparator 520.

Comparator 520 has a threshold of $V_R/4$ applied thereto and generates B<5> bit (CMP2 as shown in FIG. 5) and the result thereof is use for the 'sgn' signal applied to comparator 530.

Comparator 530 has a threshold of $V_R/8$ applied thereto and generates B<4> bit (CMP3 as shown in FIG. 5) and the result thereof is used for the 'sgn' signal applied to comparator 540.

Comparator 540 has a threshold of $V_R/16$ applied thereto and generates B<3> bit (CMP4 as shown in FIG. 5) and the result thereof is used for the 'sgn' signal applied to comparator 550.

Comparator 550 has a threshold of $V_R/32$ applied thereto and generates B<2> bit (CMPS as shown in FIG. 5) and the result thereof is used for the 'sgn' signal applied to comparator 560.

Comparator 560 has a threshold of $V_R/64$ applied thereto and generates B<1> bit (CMP6 as shown in FIG. 5) and the result thereof is used for the 'sgn' signal applied to comparator 570.

Comparator 570 has a threshold of $V_R/128$ applied thereto and generates B<0> bit corresponding to the least significant bit (CMP7 as shown in FIG. 5) and provides an output 590 when the conversion has been completed.

Figure 8:
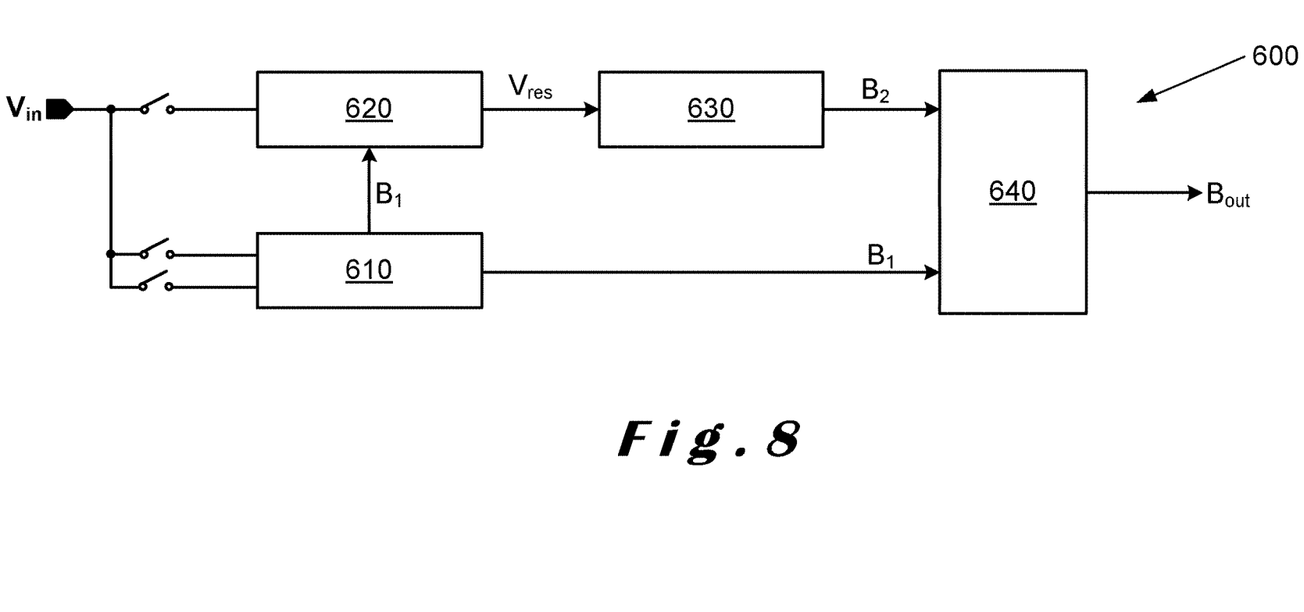
FIG. 8 illustrates an example of an ADC in which the SAR ADC of the disclosed technology forms a sub-ADC.

FIG. 8 illustrates an ADC architecture 600 for high-accuracy conversion at high speeds which can be used in a two-stage pipeline. The architecture 600 comprises an ADC 610 in accordance with the disclosed technology, which determines a code $B_1$ for a high-accuracy DAC 620. The DAC 620 provides an output $V_{res}$ which is passed to conversion stage 630, for example, another sub-SAR ADC, a flash converter, a delta-sigma, a residue amplifier/ADC combination, etc. Code $B_2$ is output from the conversion stage 630 and forms a first input to a combiner 640. Code $B_1$ from the ADC 610 forms a second input to the combiner 640 which provides an output $B_{out}$. The disclosed technology will be understood as being compatible with "off-the-shelf" combination devices known to those of skill in the art.

In this embodiment, the ADC 610 acts as a sub-ADC which resolves a limited number of bits. Once the code is known, the high-accuracy DAC 620 can be switched to generate the residue voltage which is further processed. The results of the different stages or phases are then combined so that the total ADC resolution is higher than the resolution of the sub-ADC. To achieve this higher resolution, the high-accuracy DAC 620 needs to be as accurate as the overall ADC. Due to noise and mismatch limitations, this means that the DAC capacitance increases with a factor of 4 for each extra bit of resolution.

When a SAR ADC is used as a sub-ADC, the area and power of the complete ADC are dominated by the high-accuracy DAC. The conversion time of the sub-ADC, on the other hand, is in the critical timing path of the total ADC. As the SAR ADC, in accordance with the disclosed technology, increases the speed at the cost of a limited increase in area and power, it offers an excellent trade-off for this ADC architecture.

Ideally, an ADC circuit should be designed so that the overhead of the DAC delay is minimized, for example, as described in "An 8-bit 450-MS/s Single-Bit/Cycle SAR ADC in 65-nm CMOS" by V. Tripathi and B. Murmann, ESSCIRC 2013. However, in accordance with the disclosed technology, the DAC delay is eliminated from the critical path altogether.

Multi-bit SAR ADC architectures increase the speed by resolving more than 1 bit per cycle as described in Z. Cao, S. Yan and Y. Li in "A 32 mW 1.25 GS/s 2b/step SAR ADC in 0.13 µm CMOS", ISSCC 2008. This technique reduces the number of required tasks in the algorithm and hence increases the conversion speed. The number of required comparisons increases rapidly with the number of bits per cycle. However, the architecture of the disclosed technology needs N comparisons (like a conventional SAR) whereas a 2-bits per cycle architecture needs 1.5N comparisons and a 3-bits per cycle needs 2.3N comparisons. Thus, the power and area of the comparators is increased. Moreover, the total input capacitance of the comparators is added to the top plate of the DAC which decreases the input range of the ADC.

An ADC based on the CABS algorithm (Van der Plas et al. as mentioned above) also limits the conversion time to the delay of the comparators. However, this architecture requires $2^N-1$ comparators with all possible thresholds. This not only results in a large area overhead, it is also difficult to realize a large input range since comparators with a very large threshold are needed near the edges of the input range, only slightly smaller than the input range itself. In the disclosed technology, the maximum threshold voltage is a quarter of the input range.

Several ADC architectures exist which achieve higher speeds. Flash converters limit the delay to one comparator delay at the cost of many comparators, huge area and power. Pipelining techniques increase the latency which makes them less attractive for applications as sub-ADCs in larger systems. In addition, according to the state-of-the-art they are less energy-efficient than SAR ADCs.

Advantages of the SAR ADC in accordance with the disclosed technology include:

The critical path determining the conversion time is given by a series of comparator delays increasing the conversion speed of the ADC compared to a conventional SAR: the delays due to DAC feedback tasks are eliminated from the critical path.

The number of comparisons is the same as in a conventional SAR. Hence, the total energy spent in the comparators is the same.

With a comparator-based controller, each DAC sees only half of the comparators, hence the parasitic capacitance on the top plate of each DAC is reduced and a higher input range can be achieved.

Complex logic in a system may be reduced: the complexity of the algorithm shown in FIG. 4 is the same as for the conventional SAR algorithm with some extra rewiring.

In order to achieve the advantages above, a second DAC is provided which increases the area of the SAR and almost doubles the switching energy. However, when the SAR ADC acts as a sub-ADC in an ADC with higher resolution (as shown in FIG. 8), its area and energy are not dominant for the overall area and conversion energy, whereas the overall conversion time is limited by the conversion time of the sub-ADC.

Moreover, comparators with built-in threshold voltages may be used, for example, with tunable built-in offsets as described above. Depending on the resolution, calibration might be desirable, like in conventional SAR ADCs, especially when multiple comparators are used.

Although specific embodiments of the disclosed technology are described, these are not limiting and other embodiments are possible, for example, the ADC of the disclosed technology may be used as a sub-ADC in any stage of an ADC, either in a pipelined ADC (different input signals being processed simultaneously in the different stages of the pipeline) or a multi-step ADC (operating, for example, with coarse/fine stages but sequentially).

What is claimed is:

1. A successive approximation register (SAR) analog-to-digital architecture comprising:
   at least one digital-to-analog converter (DAC) configured so as to receive an analog input signal and at least one digital code and generate an output signal therefrom;
   at least one comparator configured so as to receive the output signal from the at least one DAC at a first input, and provide a bit output based at least in part on a comparison between at least one reference signal and the output signal received from the at least one DAC; and
   a logic circuit configured so as to provide a first digital code to the at least one DAC and subsequent digital codes in response to the bit output from a preceding comparison step, control the operation of the at least one comparator, receive the bit output from the at least one comparator, and generate an output signal;
   wherein the at least one DAC comprises a first DAC and a second DAC, the first and second DACs arranged in parallel and configured so as to receive the analog input signal and digital code, the first and second DACs together with the at least one comparator forming respective first and second paths, the first path being configured for deriving odd bits in the digital code and the second path being configured for deriving even bits in the digital code;
   and wherein the first DAC is further configured so as to perform feedback steps for derived bits of the digital code while the at least one comparator performs comparison steps for even bits of the digital code, and the second DAC is further configured so as to perform feedback steps for derived bits of the digital code while the at least one comparator performs comparison steps for odd bits of the digital code.

2. The SAR analog-to-digital architecture of claim 1, wherein the at least one reference signal is applied to a second input of the at least one comparator.

3. The SAR analog-to-digital architecture of claim 2, wherein the at least one reference signal applied to the second input of the at least one comparator comprises a mid-scale value having an offset determined by a previous comparison step.

4. The SAR analog-to-digital architecture of claim 1, further comprising a switch positioned between the first and second DACs, and the at least one comparator comprises a single comparator, the switch being configured so as to alternately switch between the output signals from each of the first and second DACs to direct respective signal outputs to the first input of the single comparator.

5. The SAR analog-to-digital architecture of claim 1, wherein the at least one comparator comprises a first comparator configured so as to receive the output signal from the first DAC and generate a first bit output, and a second comparator configured so as to receive the output signal from the second DAC and generate a second bit output, the first and second comparators configured so as to alternately perform their respective comparisons.

6. The SAR analog-to-digital architecture of claim 1, wherein the at least one reference signal comprises at least one built-in offset value within the at least one comparator.

7. The SAR analog-to-digital architecture of claim 6, wherein the at least one comparator has an input configured so as to receive a control signal for selecting one of the offset values in accordance with the result of a preceding comparison step.

8. An analog-to-digital converter (ADC) comprising:
a first successive approximation register (SAR) analog-to-digital architecture comprising:
at least one digital-to-analog converter (DAC) configured so as to receive an analog input signal and at least one digital code and generate an output signal therefrom;
at least one comparator configured so as to receive the output signal from the at least one DAC at a first input, and provide a bit output based at least in part on a comparison between at least one reference signal and the output signal received from the at least one DAC; and
a logic circuit configured so as to provide a first digital code to the at least one DAC and subsequent digital codes in response to the bit output from a preceding comparison step, control the operation of the at least one comparator, receive the bit output from the at least one comparator, and generate a first output code;
wherein the at least one DAC comprises a first DAC and a second DAC, the first and second DACs arranged in parallel and configured so as to receive the analog input signal and digital code, the first and second DACs together with the at least one comparator forming respective first and second paths, the first path being configured for deriving odd bits in the digital code and the second path being configured for deriving even bits in the digital code;
and wherein the first DAC is further configured so as to perform feedback steps for derived bits of the digital code while the at least one comparator performs comparison steps for even bits of the digital code, and the second DAC is further configured so as to perform feedback steps for derived bits of the digital code while the at least one comparator performs comparison steps for odd bits of the digital code,
a third DAC configured so as to receive the input signal and the first output code from the first SAR analog-to-digital architecture and provide an output signal to an analog-to-digital converter (ADC) architecture configured so as to generate a second output code based at least in part on the output signal; and
a combiner configured so as to receive the first and second output codes and generate an output signal based at least in part on the output codes.

9. The ADC of claim 8, wherein the ADC architecture comprises a SAR analog-to-digital architecture.

10. A method of converting an analog signal to a digital signal, the method comprising:
receiving an analog input signal using at least one digital-to-analog converter (DAC);
providing a first digital code to the at least one DAC from a logic circuit;
processing the analog input signal together with the first digital code in the at least one DAC;
generating an output signal from the at least one DAC;
receiving the output signal from the at least one DAC at a first input of at least one comparator;
acquiring a comparison of the output signal and at least one reference signal;
generating a bit output based at least in part on the comparison;
receiving the bit output from the at least one comparator at the logic circuit and generating a subsequent digital code in accordance with the bit output; and
controlling operation of the at least one comparator and the first and second DACs using the logic circuit;
generating an output signal from the logic circuit after repeating at least a subset of the preceding steps using the bit output from the at least one comparator; and
for each digital code:
deriving odd bits of the digital code using a first DAC and the at least one comparator and even bits of the digital code using a second DAC and the at least one comparator; and
performing feedback steps for the derived bits of the digital code while processing the even bits of the digital code, and performing feedback steps for the derived bits of the digital code while processing the odd bits of the digital code.

11. The method of claim 10, further comprising:
alternately switching a first input to a single comparator between output signals from the first and second DACs; and
performing a comparison between respective output signals and the at least one reference signal, wherein the at least one reference signal has an offset determined in accordance with a preceding comparison step.

12. The method of claim 10, further comprising:
generating a first output bit from a first comparator;
generating a second output bit from a second comparator; and
determining the output signal based at least in part on the first and second output bits from respective ones of the first and second comparators.

13. The method of claim 10, further comprising applying the at least one reference signal to a second input of the at least one comparator as a mid-scale value having an offset determined in accordance with a preceding comparison step.

14. The method of claim 10, further comprising using at least one built-in offset value in the at least one comparator for the at least one reference signal.

15. The method of claim 14, further comprising receiving, at the at least one comparator, a control signal for selecting one of the at least one offset values in accordance with the result of a preceding comparison step.

* * * * *